(12) United States Patent
Chen et al.

(10) Patent No.: US 10,962,182 B2
(45) Date of Patent: *Mar. 30, 2021

(54) LIGHT STRING AND LIGHT STRING CIRCUITS

(71) Applicant: BLOOMING INTERNATIONAL LIMITED, British West Indies (AI)

(72) Inventors: Johnny Chen, Taipei (TW); Shu-Fa Shao, Taipei (TW)

(73) Assignee: Blooming International Limited, British West Indies (AI)

( * ) Notice: Subject to any disclaimer, the term of this patent is extended or adjusted under 35 U.S.C. 154(b) by 0 days.

This patent is subject to a terminal disclaimer.

(21) Appl. No.: 16/874,848

(22) Filed: May 15, 2020

(65) Prior Publication Data
US 2020/0278091 A1 Sep. 3, 2020

Related U.S. Application Data

(63) Continuation of application No. 16/219,657, filed on Dec. 13, 2018, now Pat. No. 10,697,598.
(Continued)

(51) Int. Cl.
*F21S 4/20* (2016.01)
*H01L 33/62* (2010.01)
(Continued)

(52) U.S. Cl.
CPC . *F21S 4/20* (2016.01); *F21S 4/10* (2016.01); *F21V 23/001* (2013.01); *H01L 33/36* (2013.01); *H01L 33/62* (2013.01)

(58) Field of Classification Search
CPC .............. F21S 4/10; F21S 4/20; F21V 23/001
See application file for complete search history.

(56) References Cited

U.S. PATENT DOCUMENTS

| 4,675,575 A | 6/1987 | Smith et al. |
| 4,761,720 A | 8/1988 | Solow |

(Continued)

FOREIGN PATENT DOCUMENTS

| CA | 2 655 486 A1 | 9/2009 |
| CN | 200982547 Y | 11/2007 |

(Continued)

OTHER PUBLICATIONS

U.S. Appl. No. 16/298,935, filed Mar. 11, 2019, Inventor Shu-Fa Shao (164 pgs.).

(Continued)

*Primary Examiner* — Alexander K Garlen
(74) *Attorney, Agent, or Firm* — Christensen, Fonder, Dardi & Herbert PLLC

(57) ABSTRACT

A light string includes an illumination device, a first wire, a second wire, soldering material, and transparent adhesive. The illumination device includes two soldering portions. The conductors of the first wire and the second wire are partially exposed to form a first soldering section and a second soldering section. Soldering material is used to attach the first soldering section and the second soldering section to the two soldering portions. The transparent adhesive forms a layer over, and covers, the illumination device, the first soldering section and the second soldering section, and extends to partially cover other portions of the first wire and the second wire.

19 Claims, 13 Drawing Sheets

Related U.S. Application Data

(60) Provisional application No. 62/598,288, filed on Dec. 13, 2017.

(51) Int. Cl.
*H01L 33/36* (2010.01)
*F21V 23/00* (2015.01)
*F21S 4/10* (2016.01)

(56) References Cited

U.S. PATENT DOCUMENTS

| | | |
|---|---|---|
| 4,812,956 A | 3/1989 | Chen |
| 4,908,743 A | 3/1990 | Miller |
| 5,109,324 A | 4/1992 | Ahroni |
| 5,150,964 A | 9/1992 | Tsui |
| 5,747,940 A | 5/1998 | Openiano |
| 5,834,901 A | 11/1998 | Shen |
| 6,113,248 A * | 9/2000 | Mistopoulos ........... F21V 23/06 362/219 |
| 6,367,952 B1 | 4/2002 | Gibboney, Jr. |
| 6,582,094 B2 | 6/2003 | Liu |
| 6,592,238 B2 | 7/2003 | Cleaver et al. |
| 6,604,841 B2 | 8/2003 | Liu |
| 6,609,814 B2 | 8/2003 | Ahroni |
| 6,777,891 B2 | 8/2004 | Lys et al. |
| 6,914,194 B2 | 7/2005 | Fan |
| 7,088,904 B2 | 8/2006 | Ryan, Jr. |
| 7,131,748 B2 | 11/2006 | Kazar et al. |
| 7,160,140 B1 | 1/2007 | Mrakovich et al. |
| 7,186,005 B2 | 3/2007 | Hulse |
| 7,235,815 B2 | 6/2007 | Wang |
| 7,253,566 B2 | 8/2007 | Lys et al. |
| 7,926,978 B2 | 4/2011 | Tsai |
| 8,371,716 B2 | 2/2013 | Shen et al. |
| 8,397,381 B2 | 3/2013 | Tsai |
| 8,562,175 B2 | 10/2013 | Chen |
| 8,568,015 B2 | 10/2013 | Chen |
| 8,592,845 B2 | 11/2013 | Chen |
| 8,608,342 B2 | 12/2013 | Chen |
| 8,641,229 B2 | 2/2014 | Li |
| 8,680,773 B2 | 3/2014 | Hering et al. |
| 8,853,721 B2 | 10/2014 | Chen |
| 9,055,777 B2 | 6/2015 | Chen |
| 9,279,551 B2 | 3/2016 | Vissenberg et al. |
| 9,291,318 B1 | 3/2016 | Benson |
| 9,655,211 B2 | 5/2017 | Altamura et al. |
| 9,788,384 B1 | 10/2017 | Harris |
| 9,887,501 B2 | 2/2018 | Chen |
| 9,907,136 B2 | 2/2018 | Leung et al. |
| 9,939,117 B1 | 4/2018 | Peng |
| 10,006,596 B2 | 6/2018 | Yu et al. |
| 10,123,387 B2 | 11/2018 | Lai |
| 10,136,497 B2 | 11/2018 | Harris |
| 10,184,654 B1 | 1/2019 | Chen |
| 10,205,073 B2 | 2/2019 | Altamura |
| 10,288,235 B1 | 5/2019 | Chen |
| 10,288,236 B1 | 5/2019 | Chen |
| 10,578,260 B1 | 3/2020 | Chen |
| 10,663,123 B2 * | 5/2020 | Plavnicky ................. F21S 4/26 |
| 10,697,598 B1 * | 6/2020 | Chen .......................... F21S 4/20 |
| 2003/0063463 A1 | 4/2003 | Sloan et al. |
| 2004/0246718 A1 | 12/2004 | Fan |
| 2006/0221609 A1 | 10/2006 | Ryan, Jr. |
| 2008/0094828 A1 | 4/2008 | Shao |
| 2009/0154156 A1 | 6/2009 | Lo et al. |
| 2010/0141161 A1 | 6/2010 | Hering et al. |
| 2010/0157598 A1 | 6/2010 | Tsai |
| 2011/0210677 A1 | 9/2011 | Hering et al. |
| 2011/0215368 A1 | 9/2011 | Chen |
| 2011/0228535 A1 | 9/2011 | Shao |
| 2011/0286223 A1 | 11/2011 | Chen |
| 2011/0303939 A1 | 12/2011 | Chen |
| 2011/0305022 A1 | 12/2011 | Chen |
| 2012/0039070 A1 | 2/2012 | Shen et al. |
| 2012/0075863 A1 | 3/2012 | Chen |
| 2012/0275157 A1 | 11/2012 | Hsu |
| 2014/0355277 A1 | 12/2014 | Lin |
| 2015/0008835 A1 | 1/2015 | Sugiura et al. |
| 2016/0186940 A1 | 6/2016 | Del Castillo et al. |
| 2016/0341408 A1 | 11/2016 | Altamura |
| 2017/0023223 A1 | 1/2017 | Tsai |
| 2017/0038055 A1 | 2/2017 | Daniels |
| 2017/0108185 A1 | 4/2017 | He |
| 2017/0295622 A1 | 10/2017 | Harris |
| 2017/0343170 A1 | 11/2017 | Yu et al. |
| 2018/0020519 A1 | 1/2018 | Harris |
| 2018/0020520 A1 | 1/2018 | Harris |
| 2018/0172225 A1 | 6/2018 | Zhao |
| 2018/0172226 A1 | 6/2018 | Zhao |
| 2018/0299084 A1 | 10/2018 | Chien |
| 2019/0053348 A1 | 2/2019 | Harris |
| 2019/0078767 A1 | 3/2019 | Loomis |

FOREIGN PATENT DOCUMENTS

| | | |
|---|---|---|
| CN | 201121811 Y | 9/2008 |
| CN | 201897194 U | 7/2011 |
| CN | 201898147 U | 7/2011 |
| CN | 201966240 U | 9/2011 |
| CN | 202613183 U | 12/2012 |
| CN | 203703878 U | 7/2014 |
| GB | 2 454 546 A | 5/2009 |

OTHER PUBLICATIONS

U.S. Appl. No. 16/547,377, filed Aug. 21, 2019, Inventor Shu-Fa Shao (177 pgs.).
U.S. Appl. No. 16/573,880, filed Sep. 17, 2019, Inventor Shu-Fa Shao (123 pgs.).
U.S. Appl. No. 16/573,890, filed Sep. 17, 2019, Inventor Shu-Fa Shao (135 pgs.).
U.S. Appl. No. 16/653,514, filed Oct. 15, 2019, Inventor Shu-Fa Shao (100 pgs.).
U.S. Appl. No. 16/405,824, filed May 7, 2019, Inventor Shu-Fa Shao (168 pgs.).

* cited by examiner

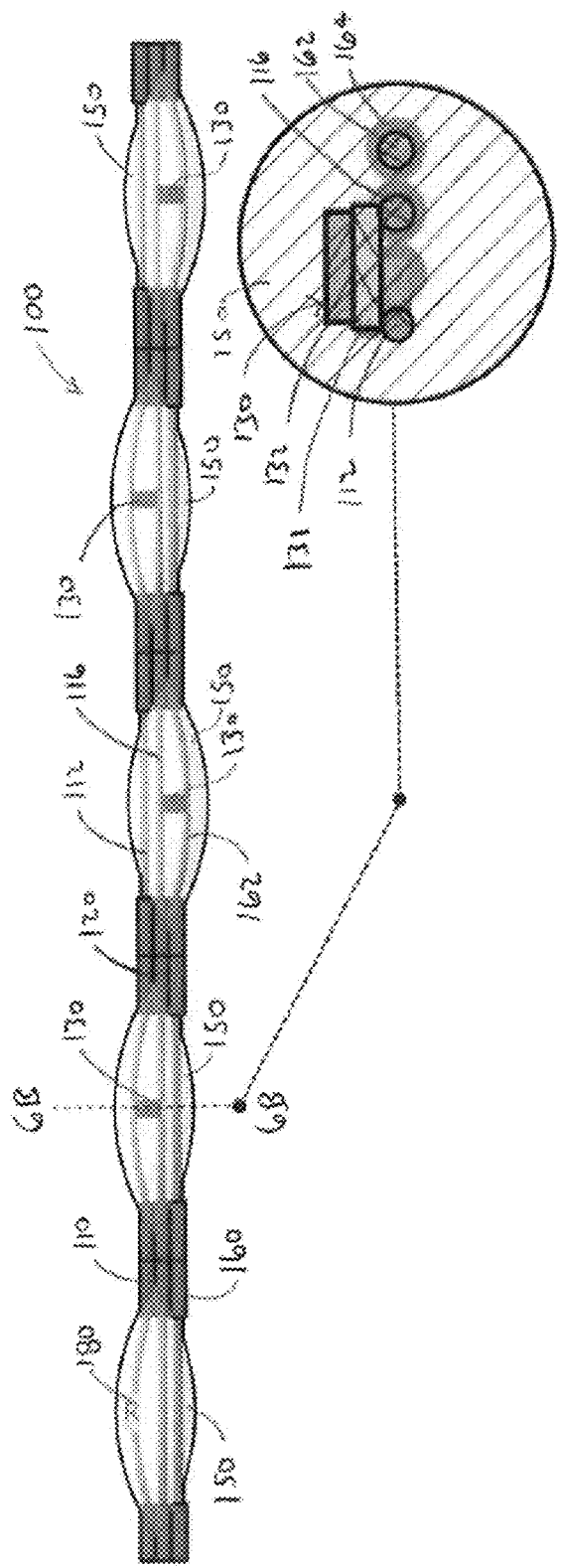

LIGHT STRING AND LIGHT STRING CIRCUITS

PRIORITY CLAIM

This application is a continuation of U.S. patent application Ser. No. 16/219,657, filed Dec. 13, 2018, which claims the benefit of U.S. Provisional Patent Application No. 62/598,288, filed Dec. 13, 2017, which are incorporated herein by reference in their entireties.

FIELD OF THE INVENTION

The instant disclosure relates to decorative light strings, and in particular, relates to light strings, circuits of light strings, and methods of manufacturing light strings.

BACKGROUND OF THE INVENTION

A light string that includes plural light sources directly soldered onto electric conductors at intervals, so as to form a string-shaped illumination device without a lamp holder, is known in the art. An example of such a light string is found in U.S. Pat. No. 8,397,381, entitled Method of Manufacturing Light Set with Surface Mounted Light Emitting Components. Light strings having many small-sized light sources, such as small bulbs that include light emitting diodes (LEDs), are commonly known. A light string is as flexible as the electric wire is, such that the light string is easily arranged in any configuration to comply with requirements for special illumination or decoration.

In the art, light sources are soldered to the copper core or conductor after the insulating layer of the electric wire or wire is removed, and then an electrical insulating treatment is performed on the solder joints. In this approach, light sources obviously stick out on the electric wire and are configured to have high-directivity. When arranging a light string, which may include pulling the light string, the light sources may be subject to forces and shocks that result in solder joints cracking. Furthermore, usually electric wires are flexible, but the soldering material is not as flexible. Thus, when the electric wire of the light string is pulled or bent, stress concentration often occurs at the soldering joints and results in soldering joints cracking.

In addition, in a light string, light sources are typically electrically connected in series or electrically connected in parallel. In parallel, precise driving voltage is required to drive the light source and prevent the light sources from being damaged by over-current. In a series connection, the number of the light sources is determined by the output voltage of the power source, with the number and type of light source being selected to ensure that every light source is driven by an appropriate voltage with an allowable voltage difference. This means that the number of the light sources is restricted by the output of the power source such that the number cannot be changed at will. Meanwhile, one damaged light can result in failure of the whole light string.

SUMMARY OF THE INVENTION

The present disclosure provides embodiments of light strings, systems and circuits thereof, as well as methods of manufacturing light strings, that present an improvement over known light strings and related systems, circuits, and methods of manufacturing.

According to an embodiment of the present disclosure, a light string includes at least one illumination device, a first wire and a second wire.

The illumination device includes a substrate and a light source; wherein the substrate includes a carrier portion and two soldering portions, the carrier portion is located between the two soldering portions, and the light source is disposed on the carrier portion. The first wire includes a first conductor, which may comprise one or more conductive strands, and a first insulating layer; wherein the first insulating layer wraps around the first conductor and the first conductor is partially exposed to form at least one first soldering section. The second wire includes a second conductor and a second insulating layer; wherein the second insulating layer wraps around the second conductor, and the second conductor is partially exposed to form at least one second soldering section. The first soldering section and the second soldering section are attached to the two soldering portions of the substrate respectively; and the light source is located between the first soldering section and the second soldering section. The soldering material is disposed onto the two soldering portions and at least partially covers the first soldering section and the second soldering section, so as to attach the first soldering section and the second soldering section to the two soldering portions respectively. In an embodiment, a transparent covering, such as an adhesive, which may be glue, covers the illumination device, the first soldering section and the second soldering section, and extends to partially cover the first insulating layer and the second insulating layer. In an embodiment, the transparent glue has a largest cross-sectional area in an area corresponding to the light source, and the cross-sectional area of the transparent glue shrinks gradually along a direction toward the first insulating layer and the second insulating layer.

According to another embodiment of the present disclosure, a circuit of light string includes a first wire, a second wire, and a plurality of illumination devices.

Each of the illumination devices includes a substrate and a light source. The substrate includes a carrier portion, an anode soldering portion and a cathode soldering portion, the carrier portion is located between the anode soldering portion and the cathode soldering portion, and the light source is disposed on the carrier portion and electrically connected to the anode soldering portion and the cathode soldering portion. The illumination devices are electrically connected to the first wire and the second wire by the anode soldering portions and the cathode soldering portions.

According to yet another embodiment of the present disclosure, a circuit of a light string includes a first wire, a second wire, a plurality of illumination devices, and a third wire.

In an embodiment, each of the illumination devices includes a substrate, a light source and a controller; wherein the substrate includes a carrier portion, an anode soldering portion and a cathode soldering portion, the carrier portion is located between the anode soldering portion and the cathode soldering portion, and the light source is disposed on the carrier portion, and electrically connected to the anode soldering portion and the cathode soldering portion; the controller is combined with the substrate for enabling and disabling the light source, and the controller includes a signal-input terminal and a signal-output terminal; and each of the illumination devices are electrically connected to the first wire by the anode soldering portions, and electrically connected to the second wire by the cathode soldering portions. The third wire includes a signal-input end and a signal-output end, and a plurality of cut-off points are arranged on the third wire. Each of the illumination devices is disposed at one of the cut-off points respectively, and the signal input terminal and the signal output terminal are electrically connected to the third wire respectively via different sides of the corresponding cut-off point. The third wire receives a control signal from the signal input end, and transfers the control signal to each of the controllers via the signal input terminals to control the corresponding light source, and the control signal is transferred to the controller of the next illumination device via the signal output terminals.

In the present disclosure, the illumination devices are securely soldered between the first wire and the second wire, and provide good illumination effect. Moreover, embodiments of circuits of light strings in the present disclosure provide a variety of approaches to supplying power, adopt various types of light source, and ensure that every light source can receives acceptable power input to prevent under voltage resulting from too many light sources.

BRIEF DESCRIPTION OF THE DRAWINGS

The present invention will become more fully understood from the detailed description given herein below for illustration only, and thus not limitative of the present invention, wherein:

FIG. 6A is a depiction of a light string having the circuit of FIG. 6, according to an embodiment of the present disclosure;

FIG. 6B is a simplified cross-sectional view of the light string of FIG. 6A;

DETAILED DESCRIPTION

Figure 1:
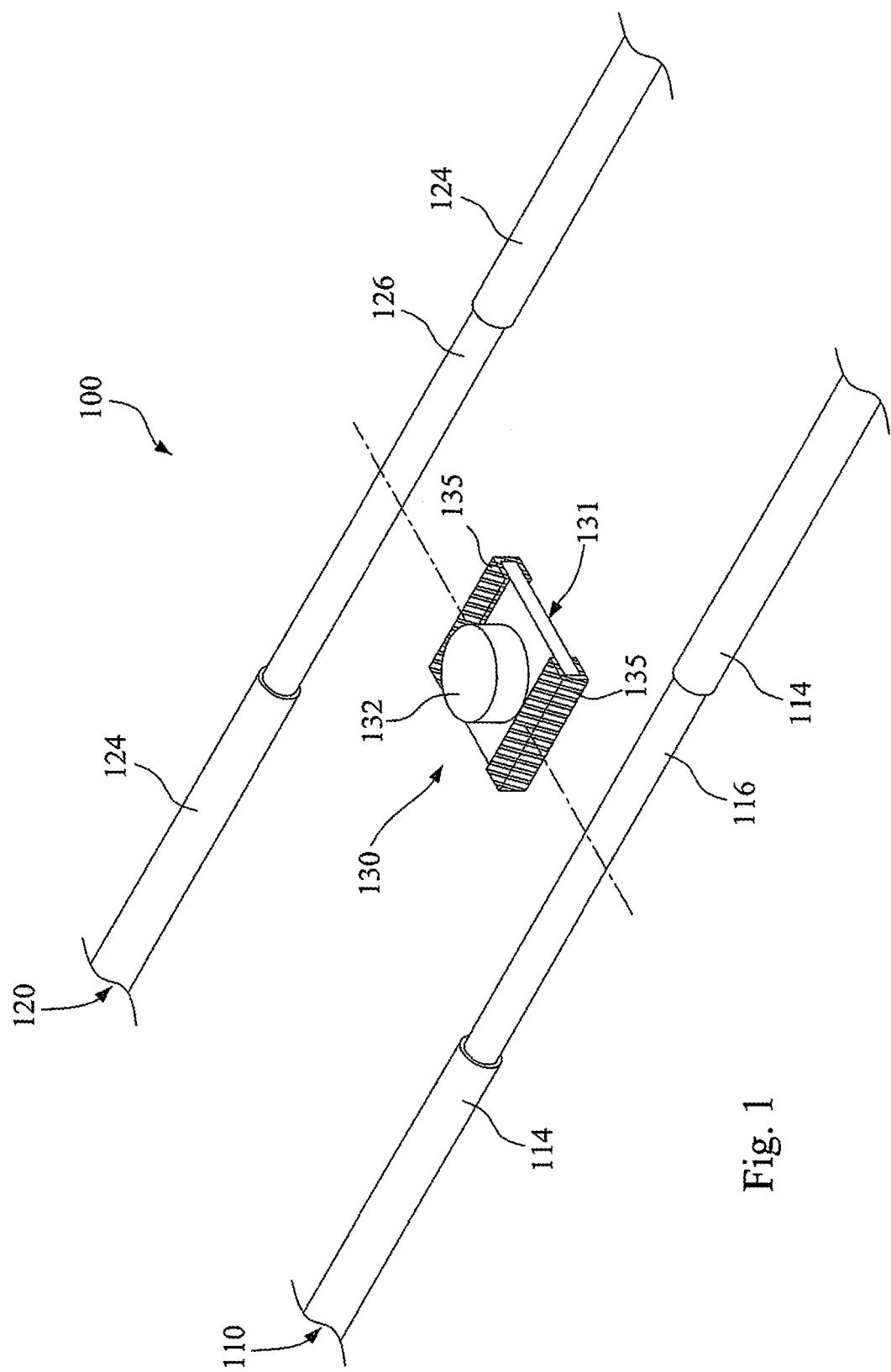
FIG. 1 is an exploded view of a first wire, a second wire and an illumination device, according to a first embodiment of the present disclosure.
Figure 2:
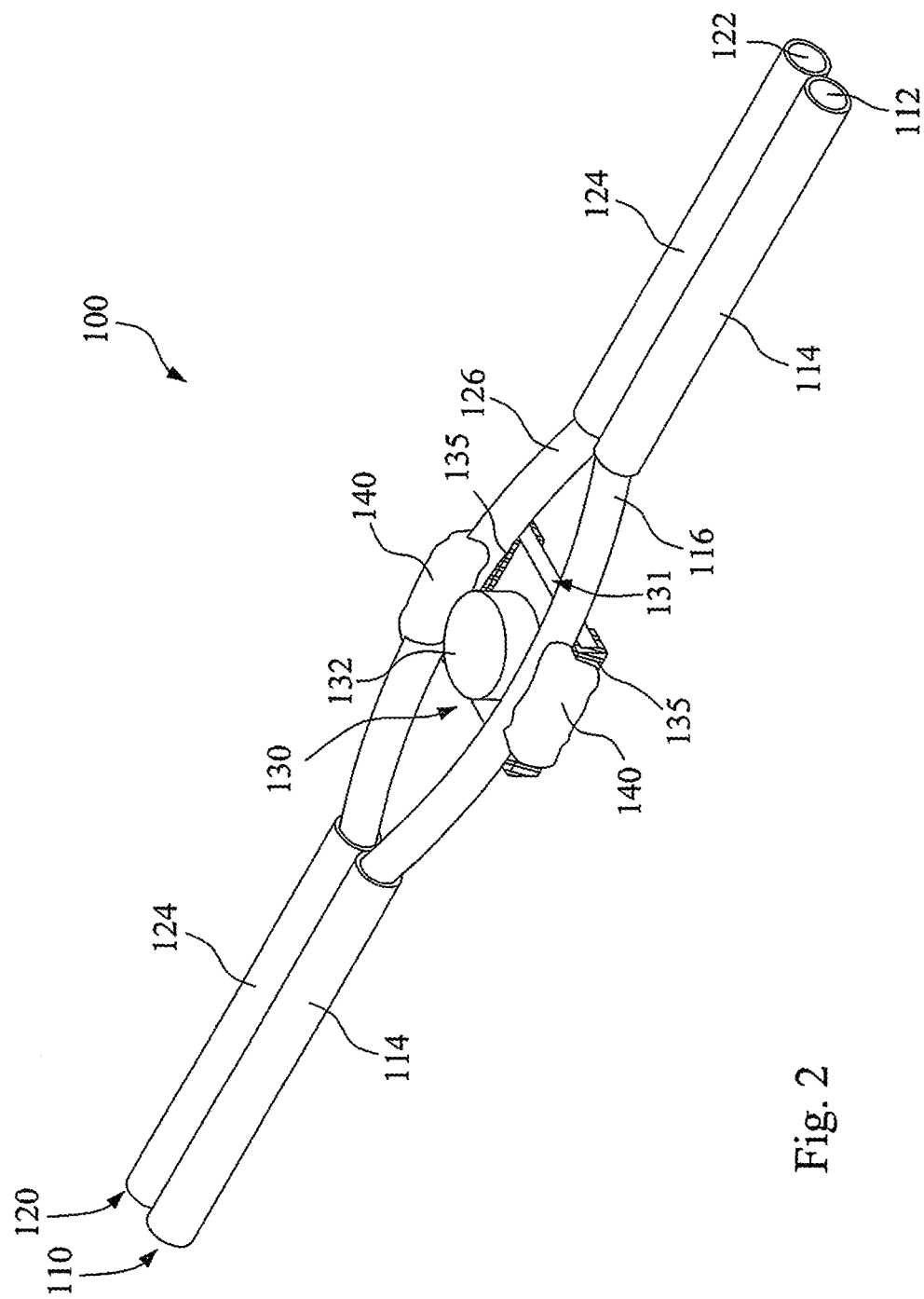
FIG. 2 is a three-dimensional view of the first wire, the second wire and the illumination device combined together, according to the first embodiment of the present disclosure.
Figure 3:
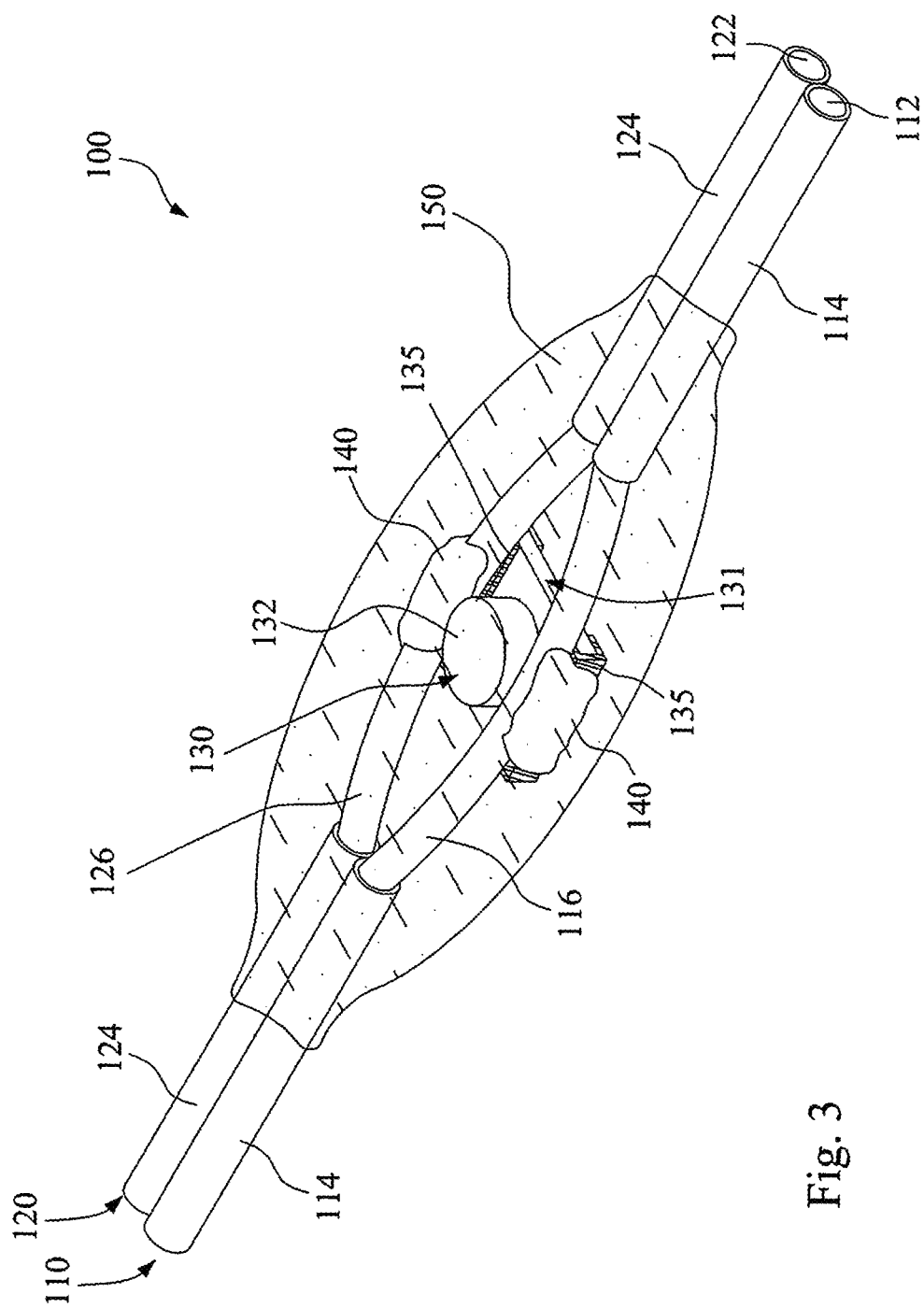
FIG. 3 is a three-dimensional view of a light string, according to the first embodiment of the present disclosure.

Referring to FIG. 1, FIG. 2 and FIG. 3, a light string 100 includes one or more illumination devices 130, a first wire 110, a second wire 120, soldering material 140 and transparent adhesive 150.

Referring to FIGS. 1-4, although only one illumination device 130 is illustrated in the drawings, the light string 100 in the present disclosure can be equipped with two or more than two illumination devices 130 and disposed between the first wire 110 and the second wire 120 in parallel. Each of the illumination devices 130 includes a substrate 131 and a light source 132. The substrate 131 includes a carrier portion 133 and two soldering portions 134. The carrier portion 133 is located between the two soldering portions 134, and the light source 132 is disposed on the carrier portion 133.

At least the surface of each of the soldering portions 134 is comprised of a conductive material 135 and respectively connected to the light source 132. In one example, a metal layer is plated on each of the soldering portions 134, to serves as the conductive material 135. In another example, each of the soldering portions 134 is made of metal, and the substrate 131 is formed by joining the insulation part (the carrier portion 133) and the conductive part (the soldering portions 134).

Figure 4:
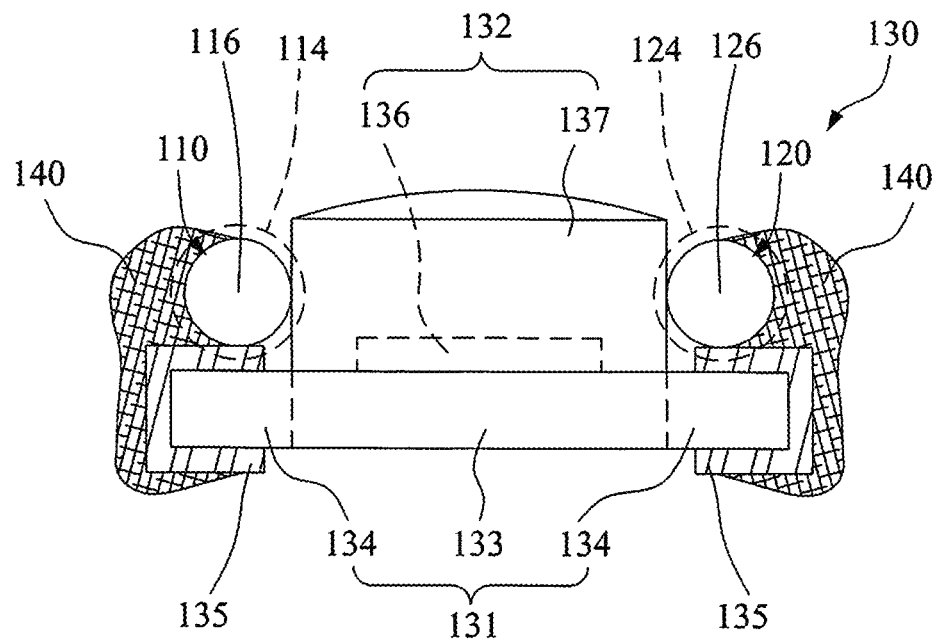
FIG. 4 is a cross-sectional view of the first wire, the second wire and the illumination device combined together according to the first embodiment of the present disclosure.

Referring to FIG. 4, the light source 132 further includes a light-emitting component 136 and a transparent package body 137. The light-emitting component 136 is disposed on the carrier portion 133 of the substrate 131, and the transparent package body 137 covers the light-emitting component 136.

In one example, the illumination device 130 is a surface-mount technology light-emitting diode (SMT LED). The light-emitting component 136 is a light-emitting diode chip. The substrate 131, in an embodiment, is a sapphire substrate. The transparent package body 137, in an embodiment, is composed of solidified glue or adhesive, wherein liquid glue is dispensed on the light-emitting diode chip and solidified to form the transparent package body 137. A convex portion is formed on the upper surface of the transparent package body 137 to increase the beam angle and the brightness of illumination. In an embodiment, the liquid glue is a resin encapsulation glue containing phosphor, and the proportion of phosphor to the rest of the liquid glue determines the fluidity of the liquid glue and the curvature of the convex.

Referring to FIG. 1, FIG. 2 and FIG. 4, the first wire 110 includes a first conductor 112 and a first insulating layer 114. In an embodiment, conductor 112 comprises a single strand conductor, and in other embodiments, comprises multiple strands, which may be twisted about one another. The first insulating layer 114 wraps around the first conductor 112, and the first conductor 112 is partially exposed to form at least one first soldering section 116. During a manufacturing process, first soldering section 112 and second soldering section 116 may be formed in a variety of ways. In an embodiment, an axial (lengthwise) pull force or tension is applied to wires 100 and 120, then a portion of insulating layers 114 and 124 are cut, in some cases circumferentially, without cutting the conductors, causing portions of the insulating layers 114 and 124 to move axially along the respective conductors, exposing a portion of the conductors of the wires, thereby creating first soldering section 112 and second soldering section 116. In an embodiment, the number of first soldering sections 116 is equal to the number of the illumination devices 130.

As shown in FIG. 1, FIG. 2 and FIG. 4, the second wire 120 includes a second conductor 122 and a second insulating layer 124. The second insulating layer 124 wraps around the second conductor 122, and the second conductor 122 is partially exposed to form at least one second soldering section 126. In an embodiment, the number of second soldering sections 126 is equal to the number of illumination devices 130, and each first soldering section 116 is paired with a second soldering section 126.

In an embodiment, and as shown in FIG. 2 and FIG. 4, the first soldering section 116 and the second soldering section 126 are attached to the two soldering portions 131 of the substrate 134 respectively, and the light source 132 is disposed between the first soldering section 116 and the second soldering section 126, such that the first soldering section 116 and the second soldering section 126 hold the illumination device 130 and its light source 132 in a clamping manner. In such an embodiment, wires 110 and 120 impart a retaining force in a direction perpendicular to a lengthwise axis of the wires, on illumination devices 130, which aids in retaining each illumination device 130 in contact with soldering sections 116 and 126.

As shown in the drawings, the soldering material 140 is disposed onto the two soldering portions 134 and partially covers the first soldering section and the second soldering section, to attach the first soldering section 116 and the second soldering section 126 to the two soldering portions 134 respectively. In an embodiment, to prevent solder joints on the first soldering section 116 and the second soldering section 126 from cracking, the soldering material 140 further extends to cover a lateral edge and a back surface of the substrate 131, and surfaces of the lateral edge and the back surface are comprised of the conductive material 135 as well. Such a method of soldering causes conductive joining of a greater conductive area of the soldering sections of the conductors of the wire, and a larger conductive area of the soldering portions of the illumination device. The result is a stronger mechanical bond, which results in a higher quality, more durable light set, and also avoids known non-wetting issues that may arise in solder joints accomplished by other manufacturing methods.

As shown in FIG. 1 and FIG. 2, in an embodiment, the transparent adhesive or glue layer 150 covers the illumination device 130, the first soldering section 116 and the second soldering section 126, and further extends to partially cover the first insulating layer 114 and the second insulating layer 124. The transparent glue 150 has a largest cross-sectional area at a location corresponding to the light source 132.

The cross-sectional area of the transparent glue 150 shrinks gradually along directions toward the first insulating layer 114 and the second insulating layer 124. That is, the transparent glue bulk 150 not only covers the illumination device 130, the first soldering section 116 and the second soldering section 126, but also covers the sections of the first second insulating layer 114 and the second insulating layer 124 which are adjacent to the transparent glue layer 150.

The material of the transparent adhesive 150 can comprise rapid solidification glue such as a UV cure adhesive. During manufacture, liquid glue is dispensed onto the light source 132 by a glue dispenser, and then the liquid glue flows over the top of the light source 132 and into the adjacent sections of the first insulating layer 114 and second insulating layer 124.

Referring FIG. 4, the transparent glue 150 extends to partially cover the first insulating layer 114 and the second insulating layer 124. In an embodiment, the transparent glue 150 when solidified is tough and may have a hardness higher than a hardness of any portion of the first wire 110 or the second wire 120. Therefore, when the first wire 110 or the second wire 120 is bent for arrange the light string 100, the section of the first wire 110 or the second wire 120 equipped with the illumination device 130 will not be bent, so as to prevent solder joints on the first soldering section 116 or the second soldering section 126 from cracking due to bending stress. Moreover, the transparent glue layer 150 also serves as a light guide device, so as to significantly increase the beam angle of the light source 132.

Figure 5:
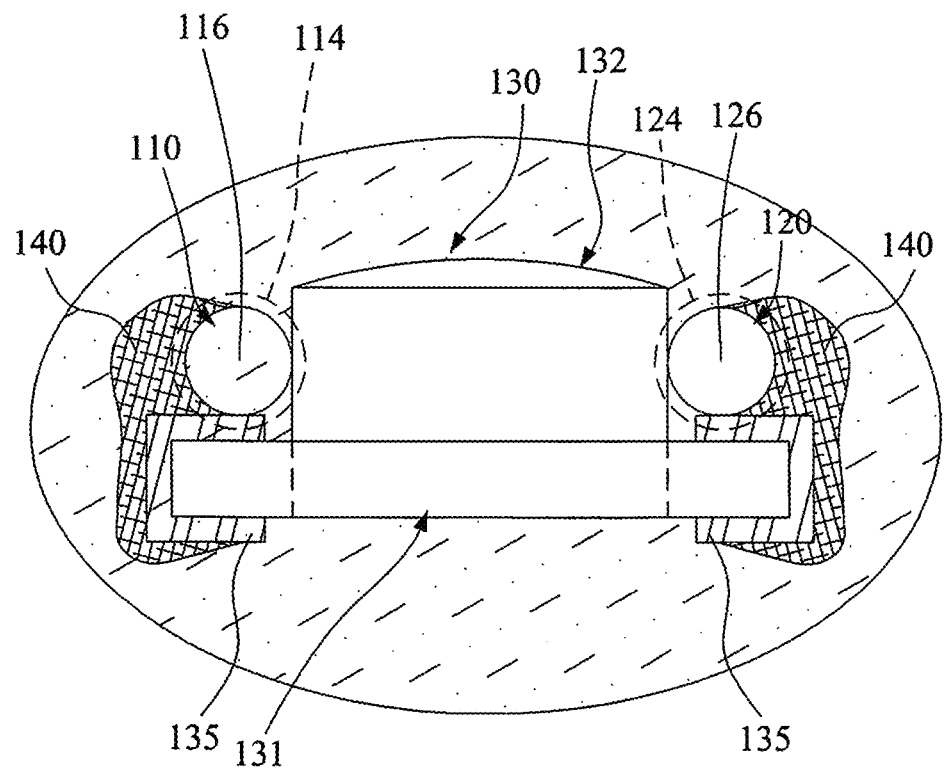
FIG. 5 is a cross-sectional view of the light string according to the first embodiment of the present disclosure.

Referring to FIG. 5, when the first wire 110 and the second wire 120 are pulled, the first soldering section 116 and the second soldering section 126 press against the illumination device 130 with only minimal shear stress between the soldering portions 134 and the first soldering section 116 or between the soldering portions 134 and the second soldering section 126. Therefore, the light string 100 also prevents solder joints on the first soldering section 116 or the second soldering section 126 from cracking due to shear stress.

That is, the coverage of the transparent glue layer 150 strengthens the light string 100 to withstand bending stress, and the arrangement of the first soldering section 116, the second soldering section 126 and the illumination device 130 strengthens the light string 100 to withstand shear stress.

In an embodiment, the first conductor 112 and/or the second conductor 122 may be solid, single-strand conductors (single piece copper conductor or metal conductor made of an appropriate conductive metal, such as copper, a copper alloy, and so on) as is depicted in FIG. 1 to FIG. 5. Alternatively, the first conductor 112 and/or the second conducting wire 122 may comprise stranded conductors instead of a single piece conductor. In the first embodiment, the first second insulating layer 114 and the second insulating layer 124 are respectively plastic insulators, such as polyvinylchloride (PVC). In one or more embodiments, the first insulating layer 114 and the second insulating layer 124 are very thin layers of insulation, such as an enamel coating, such that the first wire 110 or the second wire 120 are enameled wires. In one or more embodiments, the first insulating layer 114 and the second insulating layer 124 are combined into one piece for convenience of wire arrangement.

Figure 6:
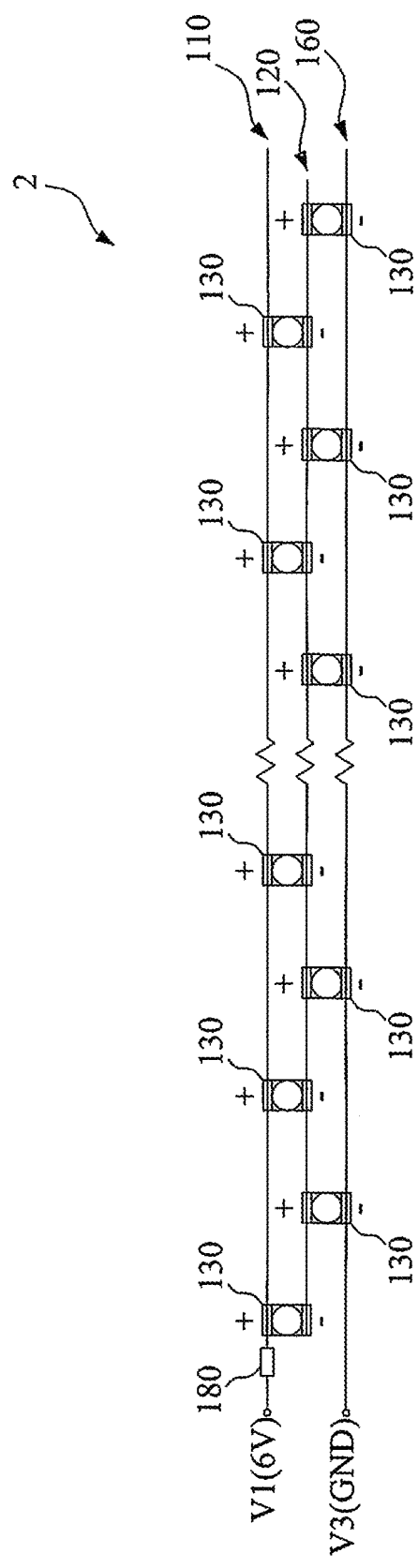
FIG. 6 is a circuit diagram of a circuit of light string according to a second embodiment of the present disclosure.

Referring to FIGS. 6, 6A and 6B, features of a 3-wire light string 100 and circuit 2 are depicted. FIG. 6 depicts an electrical schematic of a circuit 2; FIG. 6A depicts an embodiment of a 3-wire light string 100; and FIG. 6B depicts a simplified cross-sectional view of light string 100. Although FIG. 6B depicts an embodiment of illumination device 130 positioned on top of conductors 112, 116 and 162 for the sake of illustrating the basic electrical connections of illumination device 130 with wires 110, 120 and 160, it will be understood that other embodiments of light string 100 are consistent with the previous description and depictions of illumination device 130 being attached "below" or between the respective conductors.

Referring to FIG. 6, a circuit 2 of the light string 100 is depicted according to a second embodiment of the present disclosure. In the embodiment of FIG. 6, multiple illumination devices 130 are arranged in series and parallel on three wires to form light string 100.

As depicted in FIGS. 6, 6A and 6B, the circuit 2 in the second embodiment includes a first wire 110, a second wire 120, a third wire 160 and a plurality of illumination devices 130. Third wire 160 includes conductor 162 and insulation layer 164.

The first wire 110 is used to receive a first electric potential V1; and in one example, the first electric potential is 6V direct current (DC). The third wire 160 is used to receive a third electric potential V3; and in one example the third electric potential V3 is ground potential (GND). The second wire 120 is used as a connection node among the illumination devices 130.

In an embodiment, each of the illumination devices 130 is substantially identical to the illumination device 130 in the first embodiment. In the second embodiment, the soldering portions 134 of each illumination device 130 are sorted into an anode soldering portion (+) and a cathode soldering portion (−) according to the polarity of the light source 132 (in particular to the LED polarity). The carrier portion 133 as described in the first embodiment is located between the anode soldering portion (+) and the cathode soldering portion (−) and the light source 132 is disposed on the carrier portion 133 and electrically connected to the anode soldering portion (+) and the cathode soldering portion (−).

As depicted in FIG. 6, some of the illumination devices 130 are electrically connected to the first wire 110 at the anode soldering portions (+) and electrically connected to the second wire 120 at the cathode soldering portions (−). The other illumination devices 130 are electrically connected to the second wire 120 at the anode soldering portions (+) and electrically connected to the third wire 160 at the cathode soldering portions (−).

Therefore, the illumination devices 130 are sorted into two groups. In the first group, the illumination devices 130 are electrically connected in parallel by connection to the first wire 110 and the second wire 120 respectively. In the second group, the illumination devices 130 are electrically connected in parallel by connected to the second wire 120 and the third wire 130 respectively.

The first group is electrically connected to the second group in series via the second wire 120.

As shown in FIG. 6, in an embodiment, the circuit 2 further includes a current-limiting resistor 180, electrically connecting the first electric potential V1 to the first wire 110 for limiting current in the first wire 110. The current-limiting resistor 180 limits the current in the first wire 110, so as to prevent the illumination devices 130 from being damaged by over-current. In an embodiment, a section of a conductor of the wire is cut out, or the conductor is otherwise cut or interrupted, and a resistor may be soldered between the two resulting ends of the conductor.

In the second embodiment, the first wire 110, the second wire 120 and the third wire 130 are arranged in parallel. In one such embodiment, the insulating layers of the first wire 110, the second wire 120 and the third wire 160 can be combined together into a unitary layer and only the sections of the wires on which the illumination devices 130 are disposed need have insulation removed. Therefore, the circuit 2 becomes a long single-piece light string for convenience of wires arrangement.

Figure 7:
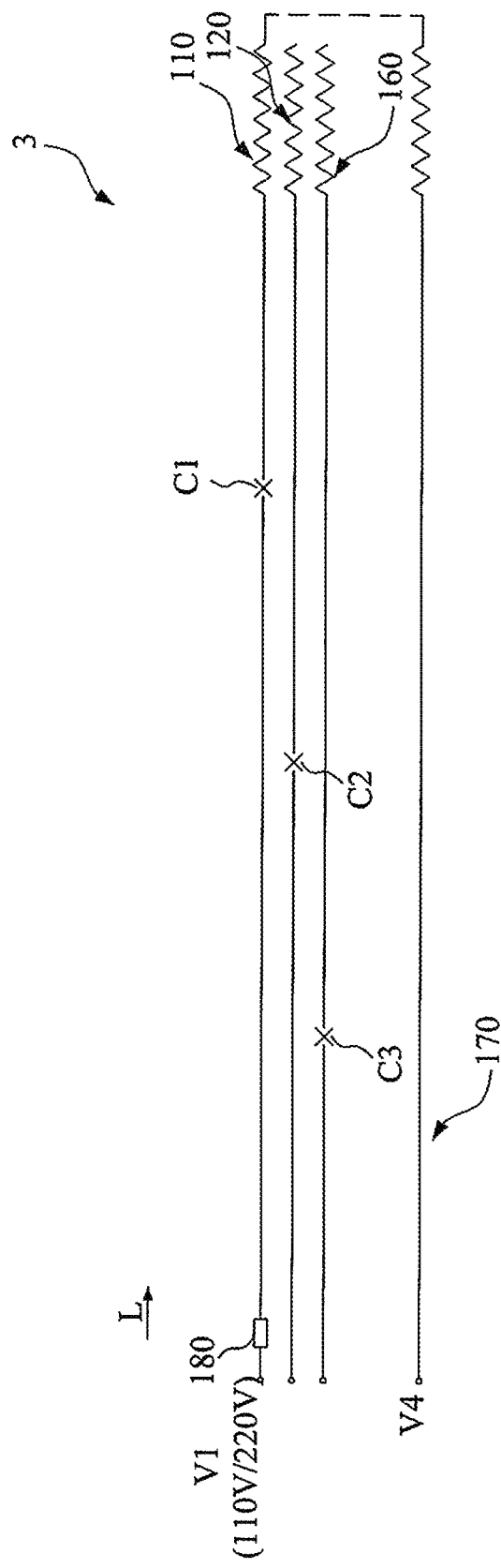
FIG. 7 and FIG. 8 are circuit diagrams of a circuit of light string according to a third embodiment of the present disclosure.
Figure 8:
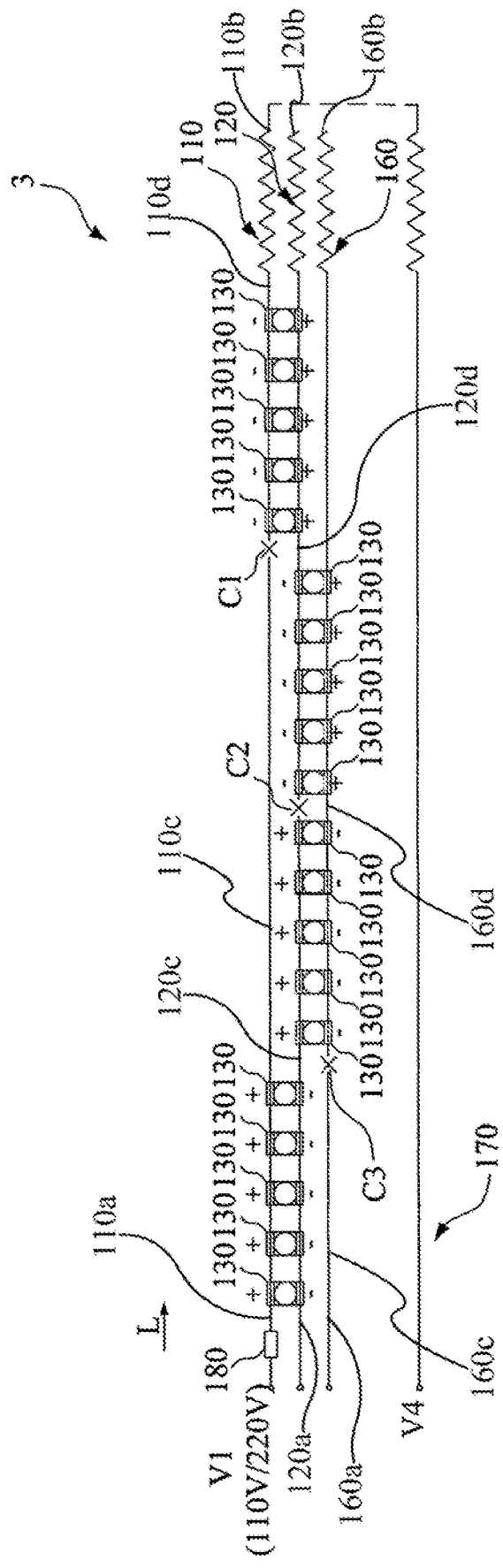

Referring to FIG. 7 and FIG. 8, a circuit 3 of the light string according to a third embodiment includes a first wire 110, a second wire 120, a third wire 160 and a plurality of illumination devices 130. The circuit 3 further includes a third cut-off point C3, a second cut-off point C2 and a first cut-point C1 to form the circuit loop in the third embodiment. Cut-off points are points along a length of the wire wherein the conductor is "broken" or interrupted, such that the conductor of the wire is not contiguous. In an embodiment, a portion of the conductor is removed to achieve a discontinuity; in other embodiments, the conductor is simply cut. In the latter embodiment, lengthwise tension on the conductor may cause a gap between ends of the conductor, or alternatively, portions of the conductor may be bent away from one another to form a gap.

As shown in FIG. 7, the first wire 110, the second wire 120 and the third wire 130 are arranged in parallel to an extension direction L; in one embodiment, the three wires are single metal wires or stranded conductors combined together by a one-piece insulating layer. The one-piece insulating layer may comprise a uniform or non-uniform layer thickness. In an embodiment, a portion of a think connecting layer joins any two conductors together.

The third cut-off point C3, the second cut-off point C2 and the first cut-point C1 are arranged sequentially along the extension direction L, respectively breaking conductive continuity of the third wire 160, the second wire 120 and the first wire 110 so as to divide the circuit 3 into a plural of sections based on the third cut-off point C3, the second cut-off point C2 and the first cut-off point C1.

In an embodiment of FIG. 7, each of the illumination devices 130 is substantially identical to the illumination device 130 in the first embodiment or the second embodiment. Each of the illumination devices 130 includes a substrate 131 and a light source 132. The substrate 131 includes a carrier portion 133, an anode soldering portion (+) and a cathode soldering portion (−). The carrier portion 133 is located between the anode soldering portion (+) and the cathode soldering portion (−). The light source 132 is disposed on the carrier portion 133, and electrically connected to the anode soldering portion (+) and the cathode soldering portion (−).

Referring to FIG. 8, the illumination devices 130 are sorted into groups. The first group of the illumination devices 130 are arranged before the first cut-off point C1 along the extension direction L, which is a longitudinal direction, (starting from the left side of FIG. 8), electrically connected to the first wire 110 by the anode soldering portions (+), and electrically connected to the second wire 120 by the cathode soldering portions (−). First wire 110 defines a first end 110a and a second end 110b, a first wire segment 110c and a second wire segment 110d, second wire 120 defines a first end 120a and a second end 120b, a first wire segment 120c and a second wire segment 120d, and third wire 160 defines a first end 160a and a second end 160b, a first wire segment 160c and a second wire segment 160d.

Referring to FIG. 8, the second group of the illumination devices 130 are arranged between the third cut-off point C3 and the second cut-off point C2 along the extension direction L, electrically connected to the second wire 120 by the anode soldering portions (+), and electrically connected to the third wire 160 by the cathode soldering portions (−).

Referring to FIG. 8, the third group of the illumination devices 130 are arranged after the second cut-off point C2 along the extension direction L, electrically connected to the second wire 120 by the cathode soldering portions (−), and electrically connected to the third wire 160 by the anode soldering portions (+).

The fourth group or the rest of the illumination devices 130 are arranged after the first cut-off point C1 and the second cut-off point C2 along the extension direction L electrically connected to the first wire 110 by the cathode soldering portions (−), and are electrically connected to the second wire 120 by the anode soldering portions (+).

With such an approach, the illumination devices 130 are sorted into four groups. In the first group, the illumination devices 130 are electrically connected in parallel by connected to the first wire 110 and the second wire 120 respectively. In the second group, the illumination devices 130 are electrically connected in parallel by connection to the second wire 120 and the third wire 130 respectively.

Meanwhile, the first group is electrically connected to the second group in serial via the second wire 120.

In the third group, the illumination devices 130 are electrically connected in parallel by connection to the second wire 120 and the third wire 130 respectively.

The polarity of the third group is opposite to the second group, and the second wire 120 between the second group and the third group is cut off by the second cut-off point C2. Therefore, the third group of illumination devices 130 is serially connected to the second group of illumination devices 130. Similarly, in the fourth group, the illumination devices 130 are electrically connected in parallel by connection to the first wire 110 and the second wire 120 respectively. The polarity of the fourth group is opposite to the first group, and the first wire 120 between the first group and the fourth group is cut off by the first cut-off point C1. Therefore, the fourth group of illumination devices 130 is serially connected to the third group of illumination devices 130.

Still referring to FIG. 8, one end of the first wire 110 receives a first electric potential V1; and in one example, the first electric potential is an alternating current (AC) voltage, such as 110V or 220V. In an embodiment, the other end of the first wire 110 is electrically connected to a boost line 170. A boost potential V4 is provided by the boost line 170 according to the electric potential of the first wire 110 and required drive voltage for driving the four groups of illumination devices 130, so as to boost the voltage applied to each illumination device 130. Generally, the longer the wire, the greater the power consumed by the LEDs, and the greater the potential to have an overall voltage drop delivered to the LEDs furthest from the connection point of the power source. Such a situation can cause some illumination devices 130 to receive a lower voltage than other devices 130, causing a disparity in light output. A solution according to an embodiment is to connect a boost line 170 as described herein.

Similarly, in the third embodiment, the first wire 110, the second wire 120, the third wire 130 and the boost line 170 are arranged in parallel, the circuit 3 becomes a long single piece light string for convenience of wires arrangement.

Still referring to FIG. 8, in an embodiment, the circuit 3 further includes a current-limiting resistor 180, electrically connecting the first electric potential V1 to the first wire 110 for limiting current in the first wire 110. The current-limiting resistor 180 limits the current in the first wire 110, so as to prevent the illumination devices 130 from being damaged by over-current. Alternatively, the current-limiting resistor 180 is disposed on the boost line 170, which is also located on the serial current loop to limit the current thereon.

Figure 9:
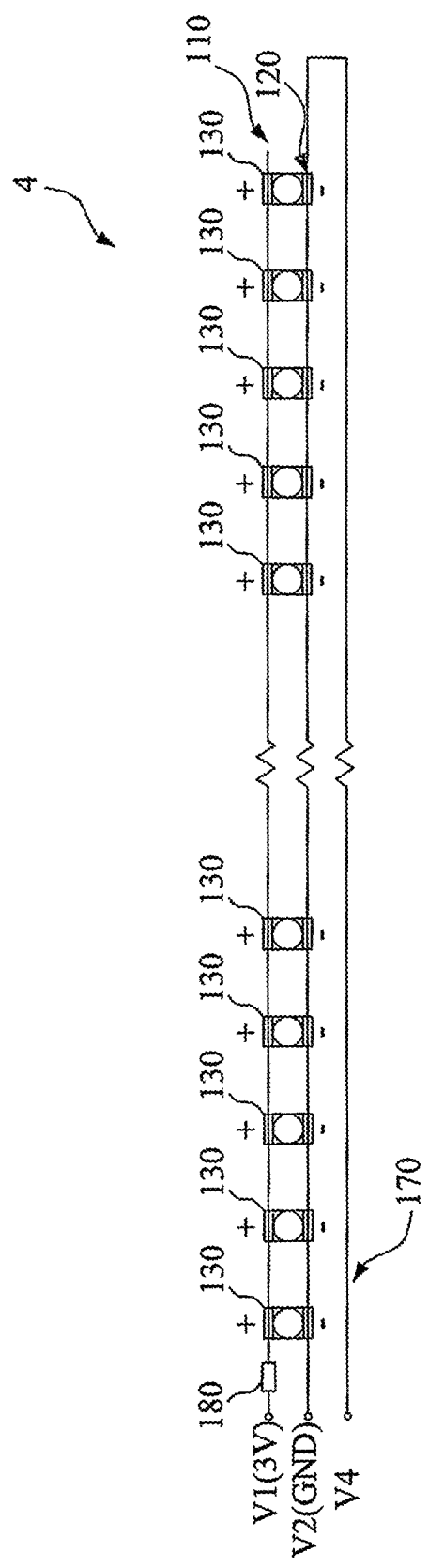
FIG. 9 is a circuit diagram of a circuit of light string according to a fourth embodiment of the present disclosure.
Figures 9A, 9B:
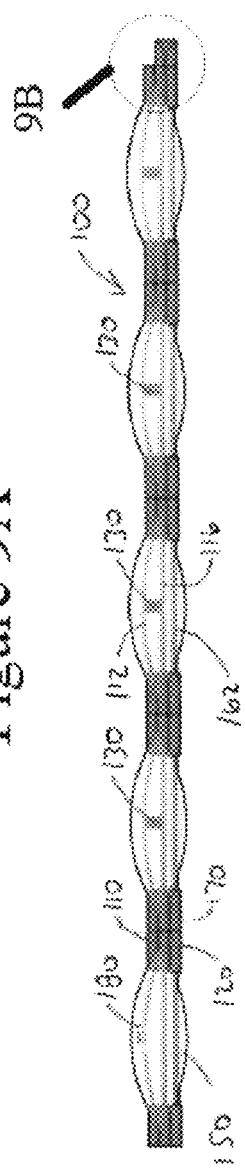
FIG. 9A is a depiction of a light string having the circuit of FIG. 9, according to an embodiment of the present disclosure.
FIG. 9B is a view of a portion of the light string of FIG. 9A, according to an embodiment of the present disclosure.

Referring to FIGS. 9, 9A and 9B, a circuit 4 of the light string is shown according to a fourth embodiment of the present disclosure.

The circuit 4 includes a first wire 110, a second wire 120, a boost line 170 and a plurality of illumination devices 130.

The first wire 110 is used to receive a first electric potential V1; and in an embodiment, the first electric potential is 3V direct current (DC). The second wire provides a second electric potential V2 and in one example the second electric potential V2 is ground potential (GND). And the boost line 170 receives a boost potential V4.

Similar to the first embodiment, each of the illumination devices 130 includes a substrate 131 and a light source 132. The substrate 131 includes a carrier portion 133, an anode soldering portion (+) and a cathode soldering portion (−). The carrier portion 133 is located between the anode soldering portion (+) and the cathode soldering portion (−). The light source 132 is disposed on the carrier portion 133. The detailed description of each illumination device 130 is described in the first embodiment. In the fourth embodiment, each of the illumination devices 130 are electrically connected to the first wire 110 by the anode soldering portions (+) and electrically connected to the second wire 120 by the cathode soldering portions (−). The boost line 170 is electrically connected to the second wire 120.

By such an approach, the illumination devices 130 are electrically connected in parallel between the first wire 110 and the second wire 120, and the illumination devices 130 are normally driven by the voltage difference between the first wire 110 and the second wire 120. A boost potential V4 is provided by the boost line 170 according to the electric potential of the first wire 110 and required drive voltage for driving the illumination devices 130, so as to boost the voltage applied to each illumination device 130.

Similarly, in the fourth embodiment, the first wire 110, the second wire 120 and the boost line 170 are arranged in parallel, the circuit 3 becomes a long single-piece light string based on the convenient joined-wire arrangement.

In an embodiment, boost line 170 is electrically connected to wire 120. In one such embodiment, and also referring to FIG. 9B, boost line 170 comprises a portion of wire 120 that is bent at bend 180, such that wire 120 extends away from a power source, then back towards the power source. In another embodiment, boost line 170 comprises a separate and distinct wire that is electrically connected to wire 120.

In an embodiment, the circuit 4 further includes a current-limiting resistor 180, electrically connecting the first electric potential V1 to the first wire 110 for limiting current in the first wire 110. The current-limiting resistor 180 limits the current in the first wire 110, so as to prevent the illumination devices 130 from being damaged by over-current. Alternatively, the current-limiting resistor 180 is disposed on the boost line 170, which is also located on the serial current loop to limit the current thereon.

Figure 10:
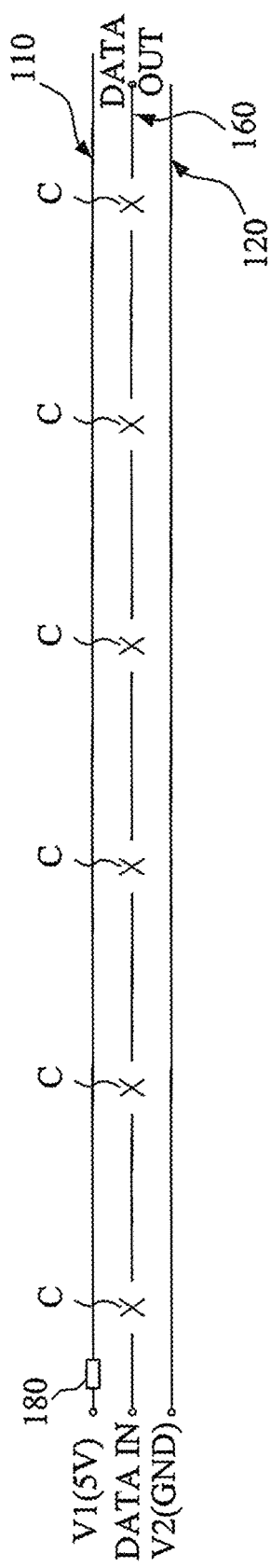
FIG. 10 and FIG. 11 are circuit diagrams of a circuit of a light string according to a fifth embodiment of the present disclosure.
Figure 11:
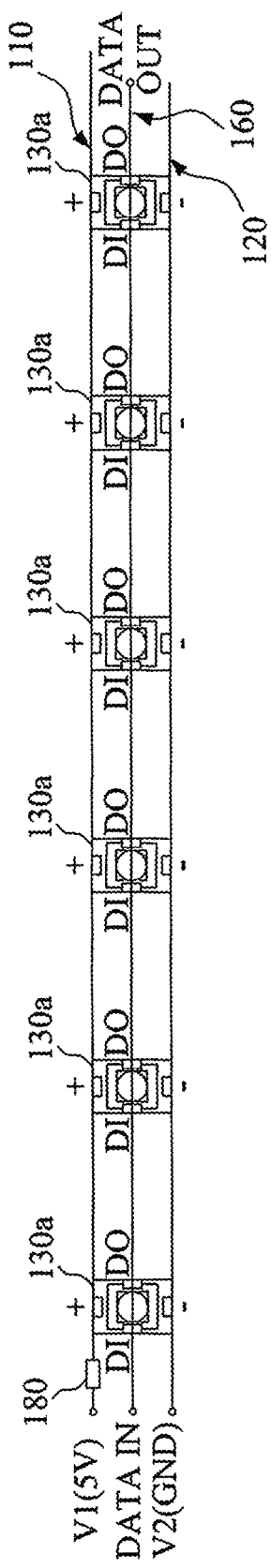

Referring to FIG. 10 and FIG. 11, a circuit 5 of the light string is shown according to a fifth embodiment of the present disclosure.

The circuit 5 includes a first wire 110, a second wire 120, a plurality of illumination devices 130, and a third wire 160.

Figure 12:
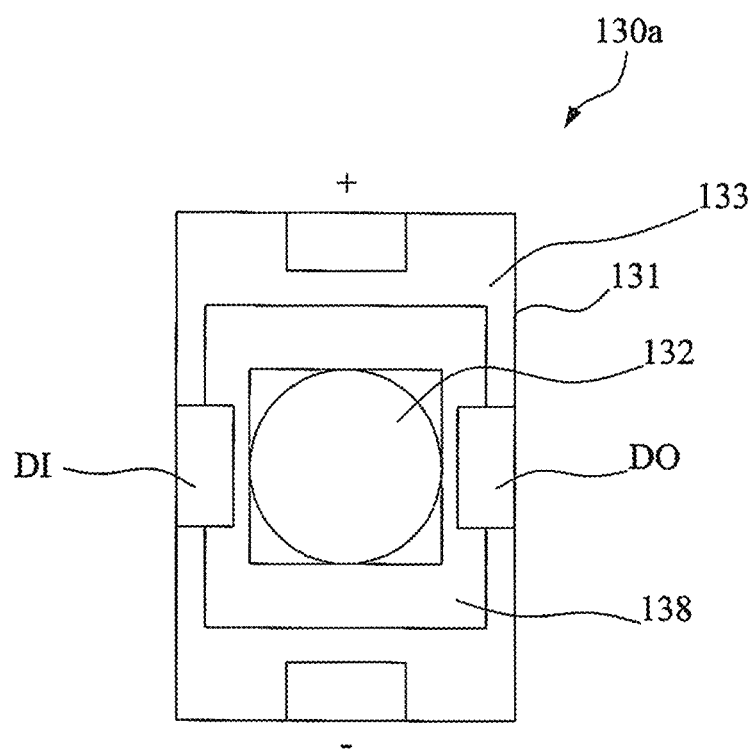
FIG. 12 is a top view of an illumination device according to the fifth embodiment of the present disclosure.

Referring also to FIG. 12, each of the illumination devices 130 may be substantially identical to the illumination device 130 in the first embodiment or the other embodiment. Each of the illumination devices 130 includes a substrate 131 and a light source 132. The substrate 131 includes a carrier portion 133, an anode soldering portion (+) and a cathode soldering portion (−). The carrier portion 133 is located between the anode soldering portion (+) and the cathode soldering portion (−). The light source 132 is disposed on the carrier portion 133, each of the illumination devices 130a are electrically connected to the first wire 110 by the anode soldering portions (+) and electrically connected to the second wire 120 by the cathode soldering portions (−). The detail of the illumination devices 130 is described in the first embodiment.

The difference of the illumination devices 130a in the fifth embodiment is that the illumination devices 130a may further include a controller 138; the controller 138 is combined with the substrate 131 for enabling and disabling the light source 132. The controller 138 includes a signal input terminal DI and a signal output terminal DO;

Referring to FIG. 10 and FIG. 11, the first wire 110 is used to receive a first electric potential V1; and in one example, the first electric potential is 5V DC. The second wire provides a second electric potential V2, and in one example the second electric potential V2 is GND. The third wire 160 includes a signal input end DATA IN and a signal output end DATA OUT, and a plurality of cut-off points C being arranged on the third wire 160. Each of the illumination devices 130 is disposed at one of the cut-off points C respectively, and the signal input terminal DI and the signal output terminal DO are electrically connected to the third wire 160 respectively via different sides of the corresponding cut-off point C. The signal input terminal DI corresponds to the signal input end DATA IN of the third wire 160. The signal output terminal DO corresponds to the signal output end DATA OUT of the third wire 160.

The third wire 160 receives control signals for enabling and disabling the light source 132 via the signal input end DATA IN. The third wire 160 transfers the control signals to the controller 138 via the signal input terminal DI for controlling the corresponding light source 138, and then the control signal is transferred to the controller 138 of the next illumination device 130a via the signal output terminal DO. Finally, the control signals are transferred to the circuit 5 of another light string.

As shown in FIG. 11, in an embodiment, the circuit 5 further includes a current-limiting resistor 180, electrically connecting the first electric potential V1 to the first wire 110 for limiting current in the first wire 110. The current-limiting resistor 180 limits the current in the first wire 110, so as to prevent the illumination devices 130 from being damaged by over-current.

In the present disclosure, the illumination devices 130 are securely soldered between the first wire 110 and the second wire 120, and provide a good illumination effect. Moreover, the circuit of light string in the present disclosure provides a variety of approaches of power supply to adopt various type of light source, and ensures every light source can receive acceptable power input to prevent under voltage resulting from too many light sources.

What is claimed is:

1. A light string, comprising:
a first wire and a second wire, each of the first wire and the second wire including a conductor portion covered by an insulation portion;
a plurality of illumination devices, each illumination device comprising a light source, a controller, a first electrical connection portion and a second electrical connection portion; wherein the controller is configured to enable and disable the light source, and the controller includes a signal input terminal and a signal output terminal, and each of the illumination devices is electrically connected to the first wire at the first electrical connection portion, and electrically connected to the second wire at the second electrical connection portion, such that each of the light sources is configured to receive electrical power from the first and second wires; and
a third wire including a conductor portion and an insulation portion, a signal input end and a signal output end, and a plurality of cut-off points defined by the third wire such that the conductor portion of the wire is non-contiguous; wherein each of the illumination devices is disposed adjacent to one of the cut-off points, respectively, and the signal input terminal and the signal output terminal are electrically connected to the third wire respectively via opposite sides of a corresponding cut-off point;
wherein the third wire receives a control signal from the signal input end, and transfers the control signal to a controller of one of the plurality of illumination devices via the controller's signal input terminal to control a corresponding light source of the illumination device, and the control signal is transferred to a controller of a next illumination device via a signal output terminal of the controller of the one of the plurality of illumination devices; and
wherein each illumination device of the plurality of illumination devices comprises a transparent covering encapsulating the light source, the controller and a portion of each of the insulation portions of the first, second and third wires, including covering one of the plurality of cut-off points.

2. The light string of claim 1, further comprising a current-limiting resistor electrically connected to the first wire for limiting current in the first wire.

3. The light string of claim 1, wherein the insulation portions of each of the first, second and third wires comprises polyvinylchloride (PVC), and the third wire is between the first wire and the second wire.

4. A light string, comprising:
a first wire extending in a first longitudinal direction, the first wire including a conductor portion and an insulation portion;
a second wire extending in the first longitudinal direction in parallel with the first wire, the second wire including a conductor portion and an insulation portion;
a third wire extending in the first longitudinal direction in parallel with the first and second wires, the third wire including a conductor portion and an insulation portion, a first wire segment of the third wire and a second wire segment of the third wire, the first and second wire segments of the third wire arranged sequentially;
a first plurality of illumination devices electrically connected to one another in parallel and aligned sequentially in the first longitudinal direction from a first illumination device of the first plurality of illumination devices to a last illumination device of the first plurality of illumination devices, each of the first plurality of illumination devices comprising a light-emitting diode (LED), an anode electrically connected to the first wire, a cathode electrically connected to the second wire, and a transparent covering over the LED and a portion of the first, second and third wire, wherein the first wire is contiguous in the longitudinal direction from the first illumination device of the first plurality of illumination devices to the last illumination device of the first plurality of illumination devices;
a second plurality of illumination devices electrically connected to one another in parallel and aligned sequentially in the first longitudinal direction from a first illumination device of the second plurality of illumination devices to a last illumination device of the second plurality of illumination devices, each of the second plurality of illumination devices comprising a light-emitting diode (LED), an anode electrically connected to the second wire and a cathode electrically connected to the third wire, and a transparent covering over the LED and a portion of the insulation portion of the second wire and a portion of the insulation portion of the third wire, wherein the second wire is contiguous in the longitudinal direction from the first illumination device of the first plurality of illumination devices to the last illumination device of the first plurality of illumination devices;
wherein the first plurality of illumination devices is electrically connected in series to the second plurality of illumination devices.

5. The light string of claim 4, wherein:
the first wire is a non-contiguous wire comprising a first wire segment and a second wire segment;
the second wire is a non-contiguous wire comprising a first wire segment of the second wire and a second wire segment of the second wire;
an anode of each of the first plurality of illumination devices is electrically connected to the first segment of the first wire and a cathode of each of the first plurality of illumination devices is electrically connected to the first segment of the second wire; and
an anode of each of the second plurality of illumination devices is electrically connected to the first segment of the second wire and a cathode of each of the second plurality of illumination devices is electrically connected to the third wire.

6. The light string of claim 4, further comprising:
a third plurality of illumination devices electrically connected to one another in parallel and aligned sequentially in the first longitudinal direction from a first illumination device of the third plurality of illumination devices to a last illumination device of the third plurality of illumination devices, each of the second plurality of illumination devices comprising a light-emitting diode (LED), an anode of each of the second plurality of illumination devices electrically connected to the second segment of the second wire and a cathode of each of the third plurality of illumination devices electrically connected to the third wire; and
a fourth plurality of illumination devices electrically connected to one another in parallel and aligned sequentially in the first longitudinal direction from a first illumination device of the fourth plurality of illumination devices to a last illumination device of the fourth plurality of illumination devices, each of the fourth plurality of illumination devices comprising a light-emitting diode (LED), a cathode of each of the fourth plurality of illumination devices electrically connected to the second segment of the second wire and an anode of each of the fourth plurality of illumination devices electrically connected to the second segment of the first wire;
wherein the first, second, third, and fourth plurality of illumination devices are electrically connected in series.

7. The light string of claim 4, wherein each conductor portion of the first, second and third wires comprises a multi-strand conductor.

8. The light string of claim 4, wherein the insulating portions of each of the first, second and third wires comprises polyvinylchloride (PVC).

9. The light string of claim 4, further comprising a current-limiting resistor in electrical series with the first plurality of illumination devices.

10. The light string of claim 4, wherein each of the illumination devices of the first plurality of illumination devices comprises a carrier defining a top surface on which an LED is mounted, and a conductor of the first wire is positioned on the top surface of the carrier.

11. The light string of claim 6, wherein the transparent covering comprises a transparent adhesive.

12. The light string of claim 11, wherein each of the conductor portion of each of the first, second and third wires is a single-strand conductor.

13. The light string of claim 5, wherein the transparent covering comprises a transparent adhesive, and an end of the first wire segment of the first wire and an end of the second wire segment of the second wire are encapsulated by the transparent covering of one of the plurality of illuminating devices.

14. The light string of claim 4, further comprising a boost line, electrically connected to one of the first, second and third wires for boosting the electric potential of the one of the first, second and third wires.

15. A light string including a first end and a second end, the light string comprising:
a first wire, a second wire and a third wire; and
a plurality of illumination devices, each of which comprises a light-emitting diode (LED) light source having an anode and a cathode, and a transparent covering; wherein the transparent covering covers the light source, and a portion of at least two wires of the first, second and third wires; and
wherein:
the first wire defines a first cut-off point where a conductor of the first wire is not contiguous, the first cut-off point being covered by one of the transparent coverings of one of the plurality of illumination devices;
the second wire defines a second cut-off point where a conductor of the second wire is not contiguous, the second cut-off point being covered by one of the transparent coverings of one of the plurality of illumination devices;
the third wire defines a third cut-off point where a conductor of the third wire is not contiguous, the third cut-off point being covered by one of the transparent coverings of one of the plurality of illumination devices;
the first wire, the second wire and the third wire all extend in an extension direction from the first end to the second end and are arranged in parallel to one another;
the third cut-off point, the second cut-off point and the first cut-point are arranged sequentially along the extension direction between the first end and the second end; and
a first group of the illumination devices are arranged between the first end and the third cut-off point along the extension direction, each LED of the illumination devices of the first group electrically connected to the first wire at an anode of the LED, and electrically connected to the second wire at a cathode of the LED;
a second group of the plurality of illumination devices are arranged between the third cut-off point and the second cut-off point along the extension direction, each LED of the illumination devices of the second group electrically connected to the second wire at an anode of the LED, and electrically connected to the third wire at a cathode of the LED;
a third group of the plurality of illumination devices are arranged between the second cut-off point and the first cut-off point along the extension direction, each LED of the illumination devices of the third group electrically connected to the second wire at a cathode of the LED and electrically connected to the third wire at an anode of the LED; and
a fourth group of the plurality of illumination devices are arranged between the first cut-off point and second end along the extension direction, each LED of the illumination devices of the fourth group electrically connected to the first wire at a cathode of the LED, and electrically connected to the second wire at an anode of the LED.

16. The light string of claim 15, further comprising a boost line, electrically connected to the first wire for boosting the electric potential of the first wire.

17. The light string of claim 15, further comprising a boost line, wherein:
   each of the plurality of illumination devices is electrically connected to the first wire at an anode soldering portion of the illumination device, and electrically connected to the second wire at an cathode soldering portion of the illumination device; and
   the boost line is electrically connected to the first wire.

18. The light string of claim 15, further comprising a controller in electrical communication with the first, second and third wires.

19. The light string of claim 15, wherein the transparent covering comprises an adhesive material.

* * * * *